US009147470B1

(12) United States Patent
Chen et al.

(10) Patent No.: US 9,147,470 B1
(45) Date of Patent: Sep. 29, 2015

(54) NAND FLASH CONTROLLER WITH PROGRAMMABLE COMMAND TEMPLATES

(71) Applicant: Marvell International Ltd., Hamilton (BM)

(72) Inventors: Chih-Ching Chen, Milpitas, CA (US); Hyunsuk Shin, San Diego, CA (US); Chi Kong Lee, Freemont, CA (US); Xueting Yu, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 382 days.

(21) Appl. No.: 13/674,503

(22) Filed: Nov. 12, 2012

Related U.S. Application Data

(60) Provisional application No. 61/558,783, filed on Nov. 11, 2011.

(51) Int. Cl.
*G11C 16/02* (2006.01)
(52) U.S. Cl.
CPC ..................................... *G11C 16/02* (2013.01)

(58) Field of Classification Search
CPC ........................................................ G11C 16/02
USPC .............. 365/185.18, 189.03, 189.05, 189.17
See application file for complete search history.

(56) References Cited

U.S. PATENT DOCUMENTS 5,926,644 A *  7/1999 Hays ................................ 712/22
2007/0150528 A1 * 6/2007 Kawamura ..................... 707/205

* cited by examiner

*Primary Examiner* — Thao H Bui

(57) ABSTRACT

Apparatus for programming a non-volatile memory, the apparatus having corresponding methods and tangible computer-readable media, comprise: a command memory configured to hold a plurality of command templates, wherein each of the command templates specifies a sequence of pad signals; a state machine configured to i) receive descriptors, wherein each of the descriptors includes a pointer to a respective one of the command templates in the command memory, and ii) generate the sequence of pad signals based on the command template indicated by the respective pointer; and a non-volatile memory interface configured to provide, to pads of the non-volatile memory, the sequence of pad signals generated by the state machine.

16 Claims, 5 Drawing Sheets

400 ⤵

| Memory Address Field 402 | Command Field 404 | Data Field 406 |

| Memory Address Field 502 | Command Pointer Field 504 | Data Field 506 |

FIG. 5

NAND FLASH CONTROLLER WITH PROGRAMMABLE COMMAND TEMPLATES

CROSS-REFERENCE TO RELATED APPLICATION

This disclosure claims the benefit of U.S. Provisional Patent Application Ser. No. 61/558,783, filed on Nov. 11, 2011, entitled "NAND Flexible Command Sequence," the disclosure thereof incorporated by reference herein in its entirety.

FIELD

The present disclosure relates generally to the field of semiconductor memories. More particularly, the present disclosure relates to programming non-volatile semiconductor memories.

BACKGROUND

Flash memory is a type of memory that is non-volatile, can be electrically erased and written, and that offers short read access times. For these reasons, flash memory has become increasingly popular in portable devices such as smartphones, digital music players, and the like, as well as in computer systems in the form of solid-state drives. Flash memory is generally implemented in a manner similar to that of NAND logic gates, and so is often referred to as NAND flash memory.

Manufacturers are currently producing many kinds of NAND flash memory, each with different modes, speeds, and protocols. These modes, speeds, and protocols are constantly evolving. In addition, some manufacturers are implementing proprietary features. Furthermore, some NAND flash memories are capable of operations in multiple protocols such as single data rate and double data rate protocols. It is difficult for customers to keep pace with these developments as they integrate these memories into their systems.

FIG. 1 shows a conventional non-volatile memory system 100. Non-volatile memory system 100 includes a non-volatile memory 110, a non-volatile memory controller 108, and a processor 106. Non-volatile memory controller 108 includes a single data rate (SDR) state machine 122A, a double data rate (DDR) state machine 122B, and a non-volatile memory interface 124. To program non-volatile memory 110, processor 106 provides SDR commands 130A to SDR state machine 122A, and provides DDR commands 130B to DDR state machine 122B. In response, SDR state machine 122A generates pad signals 126A, and DDR state machine 122B generates pad signals 126B. Non-volatile memory interface 124 provides the pad signals 126 to pads 128 of non-volatile memory 110.

In a conventional non-volatile memory system 100, changes to the modes, speeds, protocols, and the like for non-volatile memory 110 are accommodated by changing the design of the state machines 122 in the non-volatile memory controller 108. However, such changes are expensive and time-consuming to implement. In addition, changing protocols during operation requires switching from one state machine 122 to the other, after waiting for all operations of the first state machine to finish. For example, when changing from SDR protocol to DDR protocol, the non-volatile memory controller 108 must wait until all operations of the SDR state machine 122A have completed before starting the DDR state machine 122B. This costs considerable time.

SUMMARY

In general, in one aspect, an embodiment features an apparatus for programming a non-volatile memory, the apparatus comprising: a command memory configured to hold a plurality of command templates, wherein each of the command templates specifies a sequence of pad signals; a state machine configured to i) receive descriptors, wherein each of the descriptors includes a pointer to a respective one of the command templates in the command memory, and ii) generate the sequence of pad signals based on the command template indicated by the respective pointer; and a non-volatile memory interface configured to provide, to pads of the non-volatile memory, the sequence of pad signals generated by the state machine.

Embodiments of the apparatus can include one or more of the following features. In some embodiments, the descriptors are first descriptors; the state machine is further configured to i) receive second descriptors, wherein the second descriptors include no pointers to any of the command templates in the command memory, and ii) generate second sequences of pad signals based on the respective second descriptors; and the non-volatile memory interface is further configured to provide, to the pads of the non-volatile memory, the second sequences of pad signals generated by the state machine.

In general, in one aspect, an embodiment features a method for programming a non-volatile memory, the method comprising: storing a plurality of command templates in a command memory, wherein each of the command templates specifies a sequence of pad signals; receiving descriptors, wherein each of the descriptors includes a pointer to a respective one of the command templates in the command memory; generating the sequence of pad signals based on the command template indicated by the respective pointer; and providing, to pads of the non-volatile memory, the sequence of pad signals.

In general, in one aspect, an embodiment features a tangible computer-readable media embodying instructions executable by a computer to perform functions for programming a non-volatile memory, the function comprising: storing a plurality of command templates in a command memory, wherein each of the command templates specifies a sequence of pad signals; receiving descriptors, wherein each of the descriptors includes a pointer to a respective one of the command templates in the command memory; generating the sequence of pad signals based on the command template indicated by the respective pointer; and providing, to pads of the non-volatile memory, the sequence of pad signals.

The details of one or more implementations are set forth in the accompanying drawings and the description below. Other features will be apparent from the description and drawings, and from the claims.

DESCRIPTION OF DRAWINGS

FIG. 4 shows the format of a standard descriptor for a programming operation.

FIG. 5 shows the format of a flexible descriptor for a programming operation according to one embodiment.

DETAILED DESCRIPTION

Figure 1:
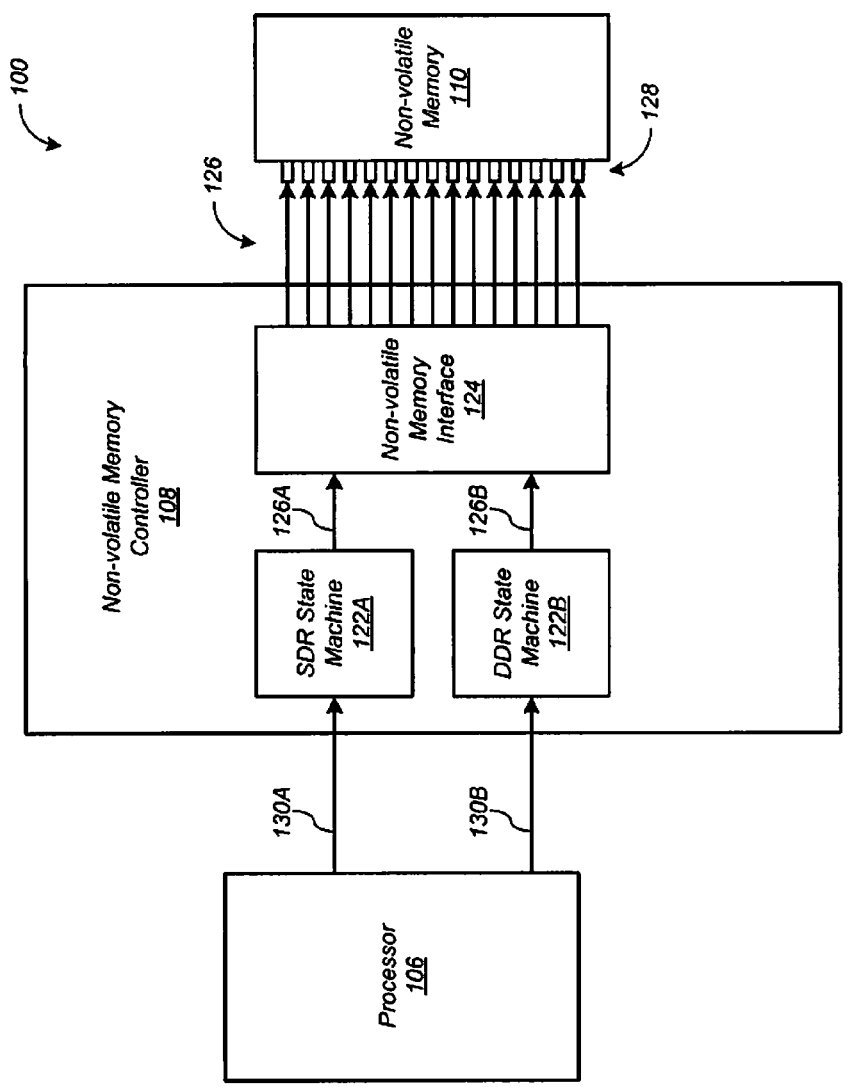
FIG. 1 shows a conventional non-volatile memory system.
Figure 2:
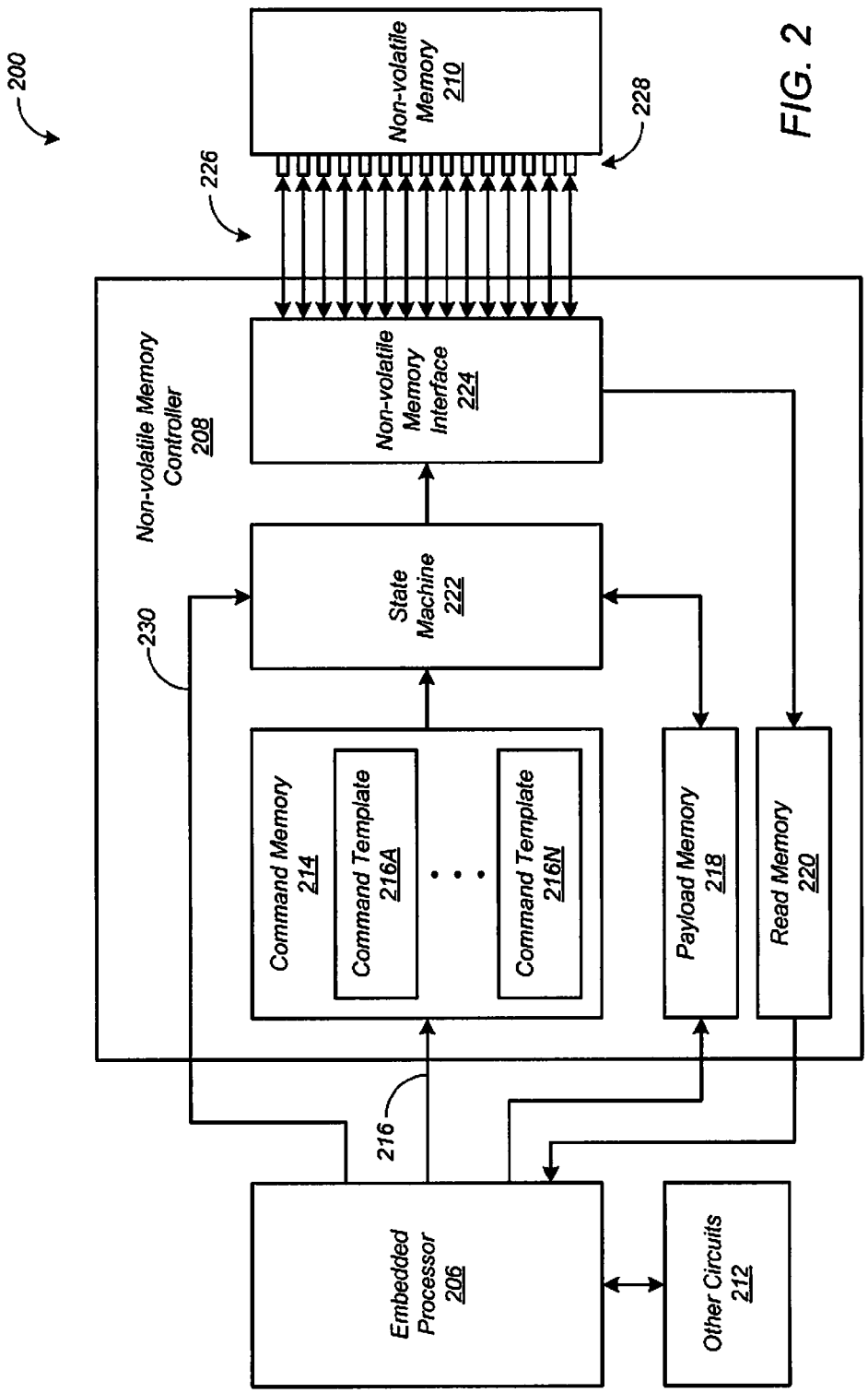
FIG. 2 shows a non-volatile memory system according to one embodiment.

Embodiments of the present disclosure provide elements of a non-volatile memory controller with programmable command templates. FIG. 2 shows a non-volatile memory system 200 according to one embodiment. Although in the described embodiments the elements of the non-volatile memory system 200 are presented in one arrangement, other embodiments may feature other arrangements. For example, elements of the non-volatile memory system 200 can be implemented in hardware, software, or combinations thereof. In the example of FIG. 2, the non-volatile memory system 200 is implemented as a system-on-chip (SoC). In other embodiments, the non-volatile memory system 200 is implemented as one or more integrated circuits, and the like.

Referring to FIG. 2, the non-volatile memory system 200 includes an embedded processor 206, a non-volatile memory controller 208, a non-volatile memory 210, and other circuits 212. Non-volatile memory controller 208 includes a command memory 214, a payload memory 218, a read memory 220, a state machine 222, and a non-volatile memory interface 224. The command memory 214 holds a plurality of command templates 216A-216N.

The non-volatile memory 210 can be implemented as any sort of non-volatile memory, including NAND flash memories and the like. The command memory 214, the payload memory 218, and the read memory 220 can be implemented as any sort of memory. The non-volatile memory interface 224, can be implemented as registers and the like. The state machine 222 can be implemented as a microcontroller and the like. Other circuits 212 can include additional memories, timing sources, peripherals, external digital and analog interfaces, power management circuits and the like.

Figure 3:
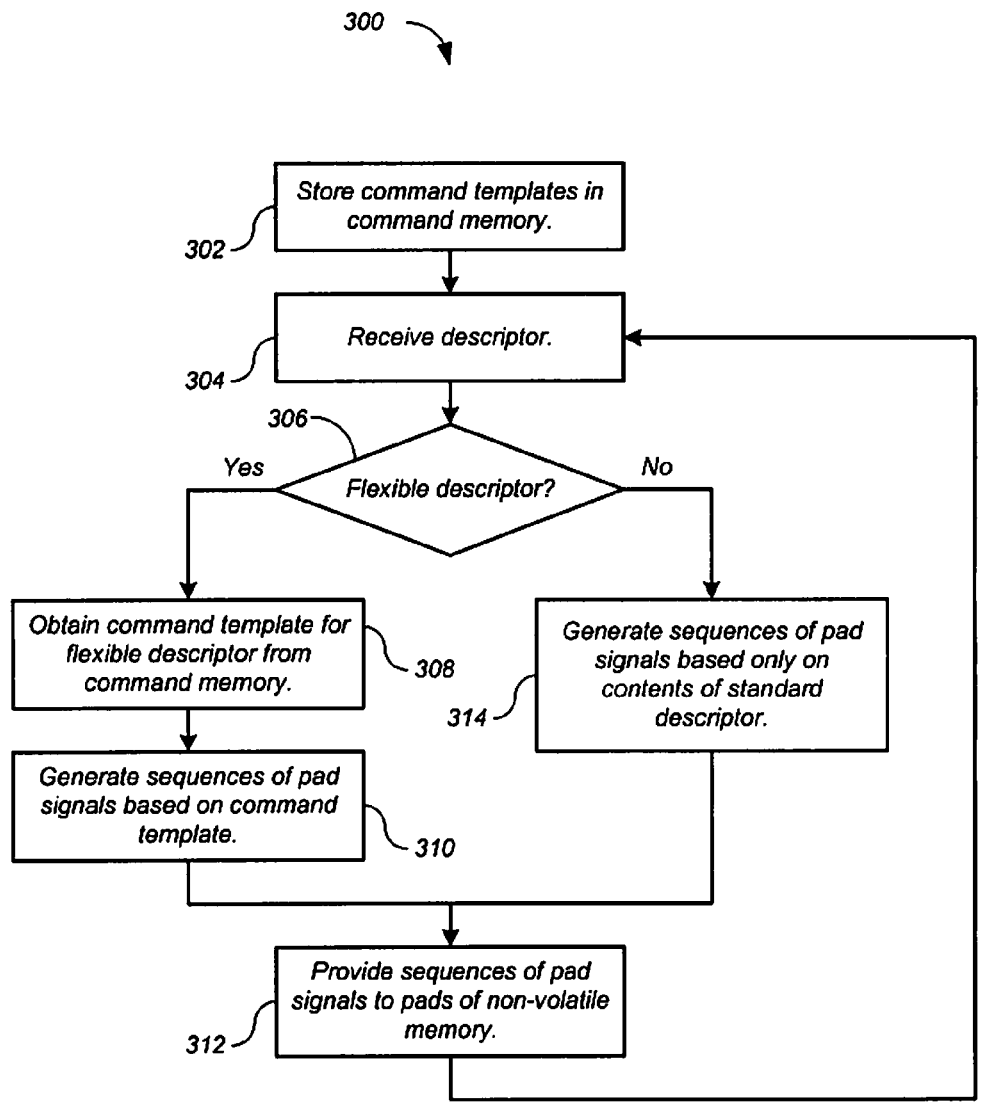
FIG. 3 shows a process for the non-volatile memory system of FIG. 2 according to one embodiment.

FIG. 3 shows a process 300 for the non-volatile memory system 200 of FIG. 2 according to one embodiment. Although in the described embodiments the elements of process 300 are presented in one arrangement, other embodiments may feature other arrangements. For example, in various embodiments, some or all of the elements of process 300 can be executed in a different order, concurrently, and the like. Also some elements of process 300 may not be performed, and may not be executed immediately after each other. In addition, some or all of the elements of process 300 can be performed automatically, that is, without human intervention.

Referring to FIG. 3, the embedded processor 206 provides the command templates 216 to the non-volatile memory controller 208. At 302, the command memory 214 stores the command templates 216. The command templates 216 can be loaded or modified by the embedded processor 206 at any time. The embedded processor 206 subsequently provides a descriptor 230 for a programming operation to the non-volatile memory controller 208. The descriptors 230 include standard descriptors, as well as flexible descriptors that are implemented according to the described embodiments.

FIG. 4 shows the format of a standard descriptor 400 for a programming operation. The standard descriptor 400 includes a memory address field 402, a command field 404, and a data field 406. The memory address field 402 contains the address of the memory locations in the non-volatile memory 210 where the programming operation is to be performed. The command field 404 contains a description of the programming operation. For example, the contents of the command field 404 indicate whether the programming operation is a write operation, a read operation, and so on. The data field 406 contains any data required by the programming operation. For example, for a write operation, the data field 406 includes the data to be written to the non-volatile memory 210.

FIG. 5 shows the format of a flexible descriptor 500 for a programming operation according to one embodiment. The flexible descriptor 500 includes a memory address field 502, a command pointer field 504, and a data field 506. The memory address field 502 contains the address of the memory locations in the non-volatile memory 210 where the programming operation is to be performed. The command pointer field 504 contains a pointer to the location in command memory 214 of the command template 216 to be used by state machine 222 for the programming operation. The data field 506 can contain data required by the programming operation. For example, for a write operation, the data field 506 can include the data to be written to the non-volatile memory 210.

Returning to FIG. 3, at 304, the state machine 222 receives the descriptor 230 from the embedded processor 206. The descriptor 230 may be a standard descriptor 400 or a flexible descriptor 500 that is implemented according to the described embodiments. If at 306, the descriptor 230 is a flexible descriptor 500, then at 308, the state machine 222 obtains a command template 216, according to the contents of the command pointer field 504 of the received flexible descriptor 500, from the command memory 214.

Figure 6:
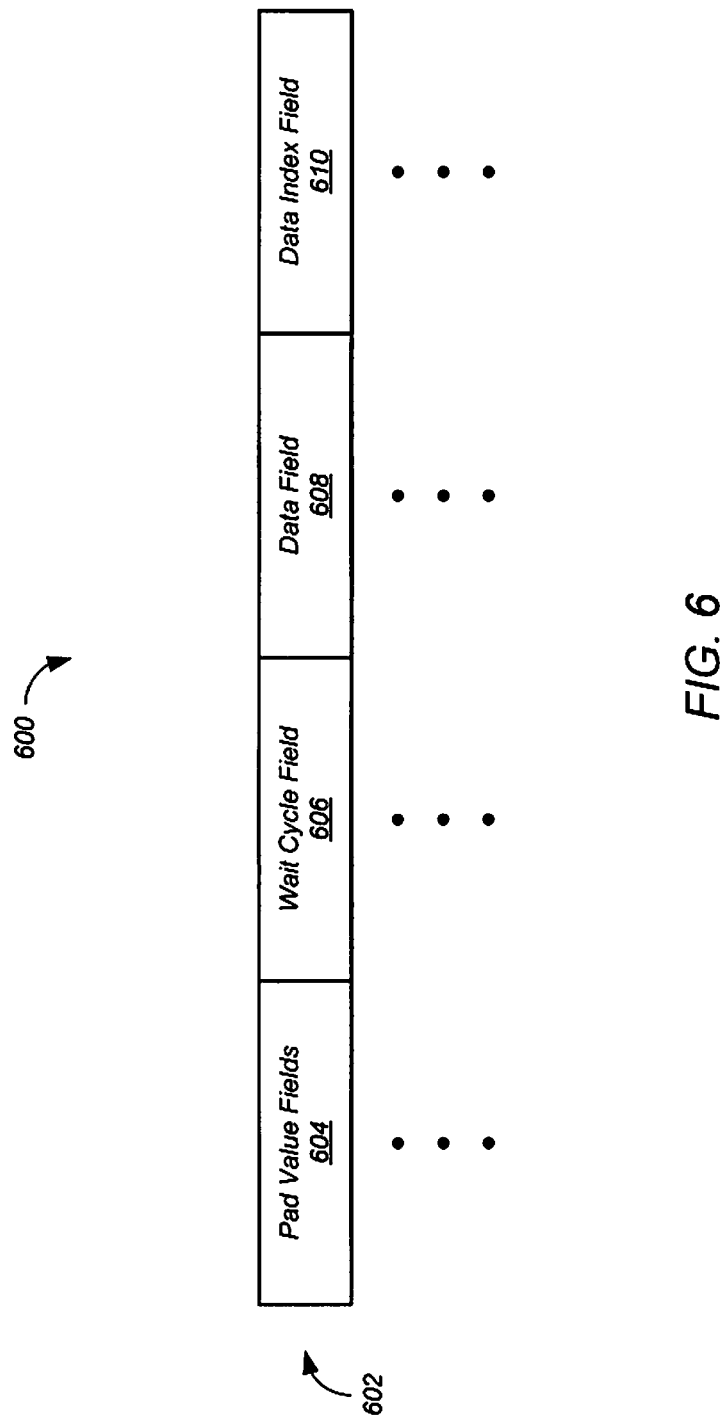
FIG. 6 shows the format of a command template according to one embodiment.

FIG. 6 shows the format of a command template 600 according to one embodiment. Referring to FIG. 6, the command template 600 includes a plurality of rows 602. Each row 602 specifies the value and timing of one or more pad signals 226 to be applied to the pads 228 of the non-volatile memory 210. Each row 602 includes a plurality of pad value fields 604, a wait cycle field 606, a data field 608, and a data index field 610. Each pad value field 604 specifies values to be applied to particular pads 228 of the non-volatile memory 210. Each wait cycle field 606 specifies an interval for which the pad values must be maintained. Each data field 608 contains the data, if any, for the command. For example, when the command is a write command, the data field 608 contains the data to be written to the non-volatile memory 210. In cases where the amount of the data is too large to be stored in a command template 216, the data is stored in the payload memory 218, and the data index field 610 includes a pointer to the data stored in the payload memory 218. The payload data can be written to the payload memory 218 by the embedded processor 206, or by the state machine 222. For example, when the same data is to be used by multiple commands, the data can be conveyed to the state machine 222 by the first descriptor 230, stored by state machine 222 in the payload memory 218, and then retrieved from the payload memory 218 by the state machine 222 for use with subsequent descriptors 230. Read memory 220 is used with read operations. In particular, data read from the non-volatile memory 210 is written by the non-volatile memory interface 224 to the read memory 220. The embedded processor 206 subsequently reads the data from the read memory 220.

Returning to FIG. 3, at 310, the state machine 222 generates sequences of pad signals 226 based on the command template 216 obtained from the command memory 214. In particular, the state machine 222 processes the rows 602 of the command template 216 in sequence, and provides the resulting sequences pad signals 226 to the non-volatile memory interface 224. At 312, the non-volatile memory interface 224 provides the sequences of pad signals 226 to the pads 228 of the non-volatile memory 210. Process 300 then continues, at 304.

If at 306, the descriptor 230 is a standard descriptor 400, then the state machine 222 executes the command in the command field 404 of the standard descriptor 400. Standard descriptors 400 include no pointers to any of the command templates 216 in the command memory 214. Therefore, at 314, the state machine 222 generates the sequences of pad signals 226 based only on the contents of the standard descriptor 400. At 312, the non-volatile memory interface 224 provides the sequences of pad signals 226 to the pads 228 of the non-volatile memory 210. Process 300 then continues, at 304.

Various embodiments of the present disclosure feature one or more of the following advantages. When the vendor of the non-volatile memory 210 changes the command sequences for programming the non-volatile memory 210, these changes can be accommodated quickly, easily, and inexpensively by simply modifying or replacing the command templates 216 stored in the command memory 214 of the non-volatile memory controller 208. No changes to the silicon of the non-volatile memory controller 208 are required. Furthermore, because all commands are processed by a single state machine 222, commands in multiple protocols can be processed simultaneously, resulting in increased performance compared with conventional controllers. For example, the disclosed state machine 222 is capable of processing a descriptor for a single data rate operation, and a descriptor for a double data rate operation, contemporaneously. The described embodiments are also capable of processing special modes employed by vendors of non-volatile memories 210. For example, some vendors require toggling the write enable pad of the non-volatile memory 210 while reading data from the non-volatile memory 210. The disclosed state machine 222 is capable of generating pad signals 226 to implement such special modes.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus for programming a non-volatile memory, the apparatus comprising:
    a command memory configured to hold a plurality of command templates, wherein each of the command templates specifies (i) a sequence of pad signals for programming the non-volatile memory, and (ii) respective values and timing of each of the sequence of pad signals;
    a state machine configured to
        receive descriptors, wherein each of the descriptors (i) corresponds to a programming operation to be performed on the non-volatile memory and (ii) includes a pointer to a respective one of the command templates in the command memory,
        retrieve the respective one of the command templates from the command memory based on the pointer, and
        generate the sequence of pad signals based on the command template indicated by the respective pointer; and
    a non-volatile memory interface configured to provide, to pads of the non-volatile memory, the sequence of pad signals generated by the state machine to program the non-volatile memory.

2. The apparatus of claim 1, wherein:
    the descriptors are flexible descriptors.

3. The apparatus of claim 1, wherein:
    the state machine is further configured to process a descriptor for a single data rate operation, and a descriptor for a double data rate operation, contemporaneously.

4. The apparatus of claim 1, wherein:
    the descriptors are first descriptors;
    the state machine is further configured to
        i) receive second descriptors, wherein the second descriptors include no pointers to any of the command templates in the command memory, and
        ii) generate second sequences of pad signals based on the respective second descriptors; and
    the non-volatile memory interface is further configured to provide, to the pads of the non-volatile memory, the second sequences of pad signals generated by the state machine.

5. The apparatus of claim 4, wherein:
    the second descriptors are standard descriptors.

6. The apparatus of claim 1, wherein:
    the command memory is further configured to receive the command templates.

7. The apparatus of claim 1, further comprising:
    a payload memory configured to hold payload data for at least one of the command templates, wherein the one of the command templates includes a pointer to the payload data in the payload memory.

8. The apparatus of claim 7, wherein:
    the payload memory is further configured to receive the payload data.

9. An integrated circuit comprising the apparatus of claim 1.

10. The integrated circuit of claim 9, further comprising:
    a processor configured to provide the descriptors to the state machine; and
    the non-volatile memory.

11. A method for programming a non-volatile memory, the method comprising:
   storing a plurality of command templates in a command memory, wherein each of the command templates specifies (i) a sequence of pad signals for programming the non-volatile memory, and (ii) respective values and timing of each of the sequence of pad signals;
   receiving descriptors, wherein each of the descriptors (i) corresponds to a programming operation to be performed on the non-volatile memory and (ii) includes a pointer to a respective one of the command templates in the command memory;
   retrieve the respective one of the command templates from the command memory based on the pointer;
   generating the sequence of pad signals based on the command template indicated by the respective pointer; and
   providing, to pads of the non-volatile memory, the sequence of pad signals to program the non-volatile memory.

12. The method of claim 11, further comprising:
   processing a descriptor for a single data rate operation, and a descriptor for a double data rate operation, contemporaneously.

13. The method of claim 11, wherein the descriptors are first descriptors, and wherein the method further comprises:
   receiving second descriptors, wherein the second descriptors include no pointers to any of the command templates in the command memory;
   generating second sequences of pad signals based on the respective second descriptors; and
   providing, to the pads of the non-volatile memory, the second sequences of pad signals.

14. The method of claim 11, further comprising:
   receiving the command templates into the command memory.

15. The method of claim 11, further comprising:
   storing payload data in a payload memory for at least one of the command templates, wherein the one of the command templates includes a pointer to the payload data in the payload memory.

16. The method of claim 15, further comprising:
   receiving the payload data into the payload memory.

* * * * *